United States Patent [19]

Erckmann

[11] Patent Number: 4,721,447

[45] Date of Patent: Jan. 26, 1988

[54] SHAPING TOOL FOR AN EXTRUDER OR CALIBRATOR FOR THERMOPLASTIC MATERIAL

[75] Inventor: Bernhard Erckmann, Wuppertal, Fed. Rep. of Germany

[73] Assignee: Reifenhauser GmbH & Co. Maschinenfabrik, Troisdorf, Fed. Rep. of Germany

[21] Appl. No.: 897,742

[22] Filed: Aug. 18, 1986

[30] Foreign Application Priority Data

Aug. 24, 1985 [DE] Fed. Rep. of Germany ....... 3530383

[51] Int. Cl.$^4$ .............................................. B29C 47/92
[52] U.S. Cl. ................... 425/141; 264/40.5; 264/176.1; 310/328; 310/369; 425/150; 425/466
[58] Field of Search ............... 425/141, 466, 381, 150, 425/465, DIG. 243; 264/40.1, 40.5, 177.1, 176.1; 310/311, 328, 369

[56] References Cited

U.S. PATENT DOCUMENTS

| 2,938,231 | 5/1960 | Lowey, Jr. ............................ 425/466 |
| 3,610,969 | 10/1971 | Clawson et al. ................. 319/369 X |
| 3,883,279 | 5/1975 | Heyer ................................. 425/141 |
| 3,940,221 | 2/1976 | Nissel ................................ 425/141 |
| 4,011,474 | 3/1977 | O'Neill ......................... 310/369 X |
| 4,125,350 | 11/1978 | Brown ......................... 425/141 X |
| 4,454,441 | 6/1984 | Taniguchi ..................... 310/369 X |
| 4,471,256 | 9/1984 | Igashira et al. ................. 310/369 X |
| 4,515,738 | 5/1985 | Anders ........................... 425/141 X |
| 4,592,710 | 6/1986 | Reifenhauser et al. ............. 425/141 |

FOREIGN PATENT DOCUMENTS 3427915 3/1986 Fed. Rep. of Germany .

OTHER PUBLICATIONS

Elektronik, 1984, pp. 92-96, (8/19.4,S.92).

Primary Examiner—Richard L. Chiesa
Attorney, Agent, or Firm—Karl F. Ross; Herbert Dubno

[57] ABSTRACT

The shaping device, particularly for an extruder tool or calibrator unit, for an extruder for thermoplastic material comprises at least one outlet defining an adjustably positionable unit lip, an opposing lip and at least one positioning member acting on the unit lip which is a part of a control and/or regulating mechanism for the thickness of the extruded product. The positioning member is a piezoelectric translator connected to a voltage source having a plurality of piezoelectric disks positioned opposing each other which are combined in a plurality of groups according to operation and according to electrical circuitry considerations. The groups of the piezoelectric disks individually and the sum total of several of the groups including the group containing all of the piezoelectric disks are connectable to the voltage source.

9 Claims, 2 Drawing Figures

SHAPING TOOL FOR AN EXTRUDER OR CALIBRATOR FOR THERMOPLASTIC MATERIAL

FIELD OF THE INVENTION

My present invention relates to a shaping device for an extrusion process and more particularly to a shaping device or tool for an extruder or a shaper-sizer or calibrator unit used for extrusion of thermoplastic material.

BACKGROUND OF THE INVENTION

A known shaping device especially useful with an extruder or calibrator used for extrusion of thermoplastic material comprises at least one outlet-defining adjustably positionable unit lip, an opposing lip, at least one positioning member acting on the unit lip and a control and/or regulating mechanism for the thickness of the plastic product of the extruder.

The positioning member or effector is a part of the control and/or regulating mechanism and is a piezoelectric translator connected to a voltage source.

Of course the thickness of the extruded product downstream of the extruder tool or calibrator unit can be regulated or controlled, since the actual value of the thickness is measured and fed to the control and/or regulating mechanism in which the desired value is stored. Also the opposing lip can be controllable by at least one positioning member in the way described here.

It is known to control the piezoelectric translator in an analog fashion with different voltages. This is taught in German Patent Document No. 34 27 915. The size of the displacement produced depends on the size of the applied electric field and the so-called piezoelectric charge constant. This approach is successful but voltage amplification may be required. It is also possible to control the piezoelectric translator with a fixed voltage in the sense of an on/off control (digital control). That leads to a displacement between two fixed end points.

OBJECTS OF THE INVENTION

It is an object of my invention to provide an improved shaping device for an extruder, calibrator unit or the like for a thermoplastic material which avoids drawbacks of earlier systems.

It is another object of my invention to provide an improved shaping device for an extruder, calibrator unit or the like used in the extrusion of thermoplastic material, in which the size of the displacement of the positioning member can be subdivided as finely as desired.

It is another object of my invention to provide an improved shaping device for an extruder, calibrator unit or the like used in the extrusion of thermoplastic material, in which the displacement of the positioning member can be as large or as small as desired with a high precision and accuracy.

SUMMARY OF THE INVENTION

These objects and others which will become more readily apparent hereinafter are attained in a shaping device, particularly for an extruder tool or calibrator unit, for an extruder for thermoplastic material comprising at least one outlet-defining adjustably positionable lip and an opposing lip, at least one positioning member acting on the adjustable lip and a control and/or regulating mechanism for the thickness of the extruded product. The positioning member or effector is a part of the control and/or regulating mechanism and is a piezoelectric translator connected to a voltage source.

According to my invention the positioning member comprises a plurality of piezoelectric disks positioned opposing each other, i.e. stacked against one another which are combined in a plurality of groups according to operation and according to electrical circuitry considerations. The groups of the piezoelectric disks individually and the sum total of several of these groups including that sum total containing all of the groups are connectable to the voltage source.

In one embodiment of my invention the number of piezoelectric disks in the individual groups is advantageously variable. The piezoelectric disks positioned opposite each other are connected in parallel as is known (Zeitschrift "Elektronik", 1984, 8/19.4,S.92).

In a positioning member comprising a plurality of piezoelectric disks connected in parallel electrically but arranged in a column or other array mechanically positioned opposing each other the displacements of the individual piezoelectric disks can add and with the designed circuitry of the groups the individual groups according to the number of piezoelectric disks in a group can provide different size group displacements which can be combined and added together according to different control circuit conditions. The accuracy or precision, i.e. the smallest displacement increment, is determined by the size of the group displacement for the group with the smallest number of piezoelectric disks.

In my invention the control of the groups or the sum total of several groups can occur in analog fashion with an applied voltage activating the piezoelectric effect which allows a suitable variation of the displacement determined by the structure of the groups and/or the sum total of several groups of piezoelectric disks. However it is easier considering circuitry principles to connect the groups or sum total of several groups of piezoelectric disks to provide an on/off (digital) control of these groups or sums of groups.

Advantageously in one embodiment of my invention which is characterized by a displacement in steps practically as large as desired, the positioning member has a plurality m of piezoelectric disks positioned opposing each other where $$m = \epsilon(2^x)_n$$

$$x = 1,2,3 \ldots$$

with n is equal to 1 or an integer greater than 1. The individual term, $(2^x)_n$, of the sum $\epsilon$ is the number of piezoelectric disks in the nth group. It is particularly advantageous when all the piezoelectric disks have the same thickness. Circuit considerations show that the required steps in the circuit design can be accomplished in a simple way. That is by connecting a continuous potential conductor to one side of the column of piezoelectric disks and a plurality of divider conductors to the other side groupwise. These divider conductors like the potential conductor are connectable with the voltage source.

In the shaping device according to my invention the positioning member can provide practically as large or as small a displacement as desired with a high precision and accuracy. There is no difficulty in providing the required circuitry and circuit features when modern electronics is employed.

BRIEF DESCRIPTION OF THE DRAWING

The above and other objects, features and advantages of my invention will become more readily apparent from the following specific description, reference being made to the accompanying highly diagrammatic drawing in which.

SPECIFIC DESCRIPTION

Figure 1:
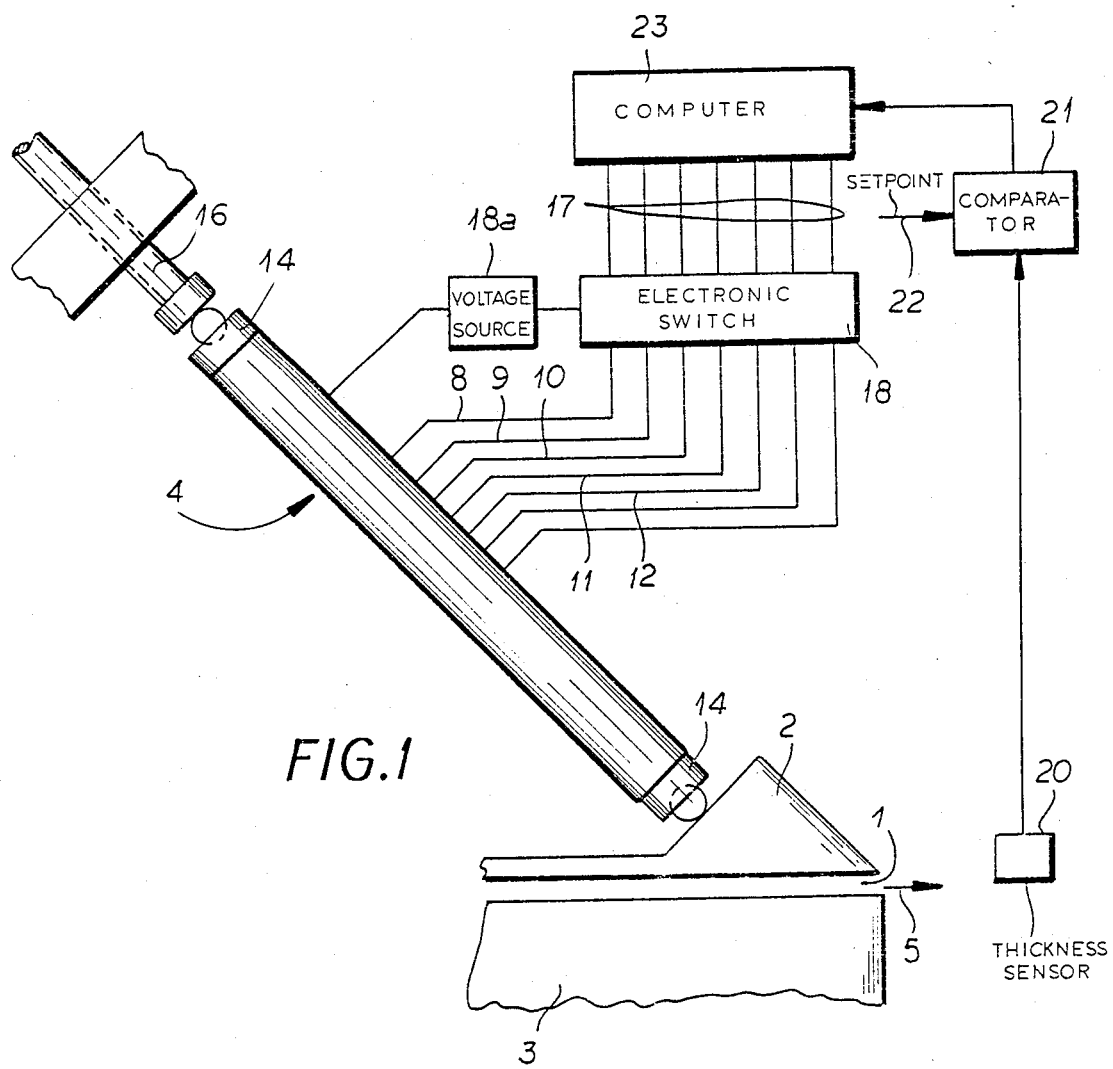
FIG. 1 is a schematic partially cutaway side elevational view of a shaping device for an extruder for thermoplastic material according to my invention with a positioning member.

FIG. 1 shows a shaping device which is a part of an extruder for a thermoplastic material. It may be a part of an extruder tool in the form of an output die or a calibrator. An outlet 1 defined by an adjustable lip 2 and an opposing lip 3 is shown.

The opposing lip 3 may be held fixed in this embodiment but it can also be movable and adjustable like the unit lip 2.

A positioning member or effector 4 acts on the unit lip 2 in this embodiment. The positioning member 4 is part of an unshown controlling and/or regulating mechanism for the thickness of the plastic product of the extruder and/or calibrator. The thermoplastic material moves in the direction of the arrow 5 shown in FIG. 1.

The positioning member 4 belongs to the control and/or regulating mechanism which has not been illustrated in full. The effector can be driven with a voltage source 18a. The thickness sensor 20 monitors the thickness of the extruded or calibrated workpiece and supplies an actual-value signal to the comparator 21 which is also supplied with the setpoint signal at 22. The error or correction signal can be applied to the computer which determines the displacement of the lip 2 required to correct the error and selects the number of piezoelectric disks accordingly.

Figure 2:
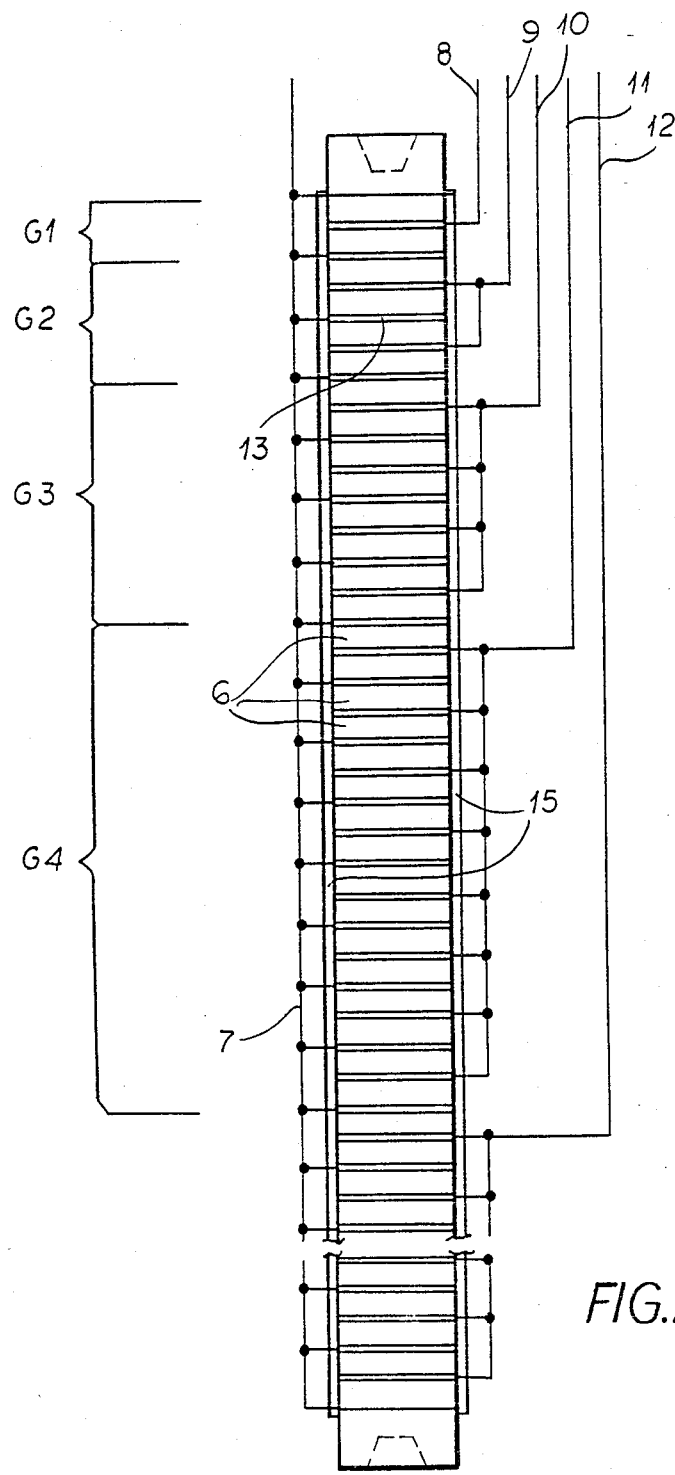
FIG. 2 is a schematic cross sectional view of the structure of the positioning member of the shaping device of FIG. 1 shown in a larger scale with some of its circuitry.

As shown in FIG. 2 the positioning member 4 has a plurality of piezoelectric disks 6 which are combined according to function and according to circuit considerations into groups $G_x$, n=1,2,3 . . . , that is into the groups G1, G2, G3, G4 . . . The groups G1, G2, G3, G4 of the piezoelectric disks 6 are individually connectable to the source 18a of voltage via the electronic switch 18 controlled by the computer 23.

Furthermore the sum total formed from several groups (e.g. G1+G2 or G1+G2+G3) including the sum total of all the groups is also connectable to the voltage source 18a, i.e. the groups of parallel acting disks can be excited individually, severally and jointly. The device is so designed that the number of piezoelectric disks 6 in the individual groups G1, G2, G3, G4, . . . is variable in accordance with operation.

In this embodiment the positioning member 4 has a plurality m of piezoelectric disks 6 positioned opposite each other and of course where $$m = \epsilon(2^x)_n$$

$$x = 1,2,3, \ldots$$

with n being equal to 1 or an integer greater than one. The individual term, $(2^x)_n$, of the sum determines the number of the piezoelectric disks 6 in the individual groups $G_n$. In this embodiment n=1, 2, 3, 4 . . . so that the first group G1 has two piezoelectric disks, (x=1) the second group G2 has four piezoelectric disks, (x=2) the third group G3 has either piezoelectric disks (x=3) and so forth. These groups are as has already been mentioned each individually connectable to the voltage source 18a or a sum total of several groups including the sum total of all the groups can be connected to the source of EMF. Also in this embodiment all the piezoelectric disks 6 have the same thickness.

From FIG. 2 one can infer a comparatively simple circuit associated with these piezoelectric disks 6. It is particularly characterized by the piezoelectric disks 6 being connected on one side to a continuous potential conductor 7 (common conductor) and on the other side groupwise to distributor conductors 8, 9, 10, 11, and 12 which, like the potential conductor 7, are connectable with the voltage source 18a.

The control can be analog. It is particularly advantageous that the control can occur with a fixed voltage while nevertheless displacements can be produced with a high accuracy. The positioning member 4 in as much as it is digital also requires for control only a fixed voltage from null to maximum which is connected to the individual groups $G_n$, n=1,2,3 . . . and/or sums of groups in the described way, wherein each circuit acts on the positioning member 4 with an on/off (digital)action which sets up a displacement or position adjustment of a suitable accuracy but nevertheless with any size the operator wishes. The minimum displacement is attained when only the first group G1 is controlling and no potential difference exists across all the other piezoelectric disks 6. The first group G1 can comprise a single piezoelectric disk 6 but in this embodiment it comprises two of them. The position adjustment of each individual piezoelectric disk 6 is understandably determined by a constant whose value depends on the strength of the electric field and the piezoelectric charge constant. The number of possible circuits can be derived from known mathematical principles and can be set accordingly. The adjusting speed may be influenced by the electric current. The following conditions must be fulfilled: The positive and negative displacements must occur for the first 95% of the displacement with the same speed. The positioning speed for all groups $G_n$, n=1,2,3 . . . must be equal. The switching in and switching out of the individual groups $G_n$, n=1,2,3 . . . or the sum total of the individual groups must occur at the same time which modern electronics permits with very high precision. It is understood that electrodes 13 are positioned between the individual piezoelectric disks 6 which are required for the described control. Metal caps 14 are put on the ends of the piezoelectric disks 6 opposing each other. A lacquer layer 15 is applied as an insulation.

In the embodiment of FIG. 1 the null point can be set by a set up device 16. The voltage is selectively fed to the feed conductors 17 by the control circuit or switch 18. The connecting circuit 18 determines which of the groups $G_x$, x=1,2,3 . . . and sums of groups are turned on by the associated control and regulating means. All others not activated as already mentioned are at the null potential.

The control and/or regulating mechanism by definition comprises the positioning member 4, the potential conductor 7, the divider conductors 8 to 12, the connecting circuit 18, the feed conductors 17 and of course the unshown other circuits controlling the signals sent along the feed conductors 17 and the rest of the servo-mechanism including those needed for measurement of the thickness of the extruded product.

The source of voltage 18a can be a part of the connecting circuit 18.

I claim:

1. In a shaping device, particularly for an extruder tool or calibrator unit, for an extruder for thermoplastic material comprising at least one outlet-defining adjustable lip and an opposing lip, at least one positioning member acting on said adjustable lip and a control and regulating mechanism for the thickness of the extruded product from said extruder, said positioning member being a part of said control and regulating mechanism and being a piezoelectric translator connected to a voltage source, the improvement wherein said positioning member comprises a plurality of piezoelectric disks positioned opposing each other which are combined in a plurality of groups according to operation and according to electrical circuitry considerations and said groups of said piezoelectric disks individually and in totality being connectable to said voltage source, said positioning member having m of said piezoelectric disks where $$m = \epsilon(2^x)_n$$

$$x = 1,2,3 \ldots$$

and wherein n represents the group and is equal to one or an integer greater than one and $(2^x)_n$ is the number of said piezoelectric disks in each of said groups.

2. The improvement according to claim 1 wherein said plurality of said piezoelectric disks in the individual ones of said groups is variable.

3. The improvement according to claim 1 wherein each of said piezoelectric disks has the same thickness.

4. The improvment according to claim 1 wherein said piezoelectric disks are connected on one side to a continuing potential conductor and on the other side groupwise to a plurality of divider conductors which like said potential conductor are connectable to said voltage source.

5. A shaping device, particularly for an extruder tool or calibrator unit, for an extruder for thermoplastic material comprising:

at least one outlet-defining adjustable lip;
an opposing lip;
at least one piezoelectric translator having a plurality m of piezoelectric disks positioned opposing each other which are combined in a plurality of groups according to operation and circuitry considerations, said piezoelectric translator being positioned on said adjustable lip to act as a positioning member which is a part of a control and/or regulating mechanism for the thickness of the extruded product; and a voltage source connectable to said groups of said piezoelectric disks individually and to the sum total of a plurality of said groups including that one of said sum totals containing all of said groups; and said plurality m being defined by the equation $$m = \epsilon(2^x)_n$$

$$x = 1,2,3 \ldots$$

wherein n represents the group and is equal to one or an integer greater than one and $(2^x)_n$ is the number of each piezoelectric disks in each of said groups.

6. A device for shaping a thermoplastic synthetic resin which comprises:

a pair of lips defining a gap through which said thermoplastic synthetic resin is passed to impart a dimension to the thermoplastic synthetic resin determined by a spacing between said lips, at least one of said lips being adjustable relative to the other of said lips;

means for monitoring said dimension of the thermoplastic synthetic resin emerging from said lips;

control means responsive to said means for monitoring for generating a control signal for adjusting the spacing of said lips to control said dimension; and an effector connected to said control means and acting upon said one of said lips for displacing same in response to said signal, said effector including:

a stack of piezoelectric translator disks subdivided into groups of mutually juxtaposed disks, means for selectively exciting the disks of each group in parallel simultaneously and jointly, severally and individually exciting the groups as required in response to said control signal to obtain a degree of displacement of said one of said lips required to maintain said dimension at a selected value, and said effector comprising a number n of juxtaposed disks in said stack, wherein $$m = \epsilon(2^x)_n$$

$$x = 1,2,3 \ldots$$

and n is an integer at least equal to 1, $(2^x)_n$ representing the number of disks in the individual groups Gn, n=1,2,3 . . . .

7. The device defined in claim 6 wherein the number of said disks in said groups varies from group to group in said stack.

8. The device defined in claim 6 wherein said disks all have the same thickness.

9. The device defined in claim 6 wherein said disks all are connected to a common current source by a common conductor, and the disks of each group are connected to the source by another conductor common to the disks of the group but individual to the respective group.

* * * * *